United States Patent
Xie et al.

(10) Patent No.: US 9,704,973 B2
(45) Date of Patent: Jul. 11, 2017

(54) METHODS OF FORMING FINS FOR FINFET SEMICONDUCTOR DEVICES AND THE SELECTIVE REMOVAL OF SUCH FINS

(71) Applicant: GLOBALFOUNDRIES Inc., Grand Cayman (KY)

(72) Inventors: Ruilong Xie, Niskayuna, NY (US); Andy C. Wei, Queensbury, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 469 days.

(21) Appl. No.: 14/242,130

(22) Filed: Apr. 1, 2014

(65) Prior Publication Data
US 2015/0279971 A1  Oct. 1, 2015

(51) Int. Cl.
*H01L 29/66* (2006.01)

(52) U.S. Cl.
CPC .. *H01L 29/66795* (2013.01); *H01L 29/66818* (2013.01)

(58) Field of Classification Search
CPC ........................ H01L 27/10879; H01L 27/1211
See application file for complete search history.

(56) References Cited

U.S. PATENT DOCUMENTS

2007/0048947 A1* 3/2007 Lee .................. H01L 21/26586
                                                  438/283
2015/0255457 A1* 9/2015 Loubet ............... H01L 27/0886
                                                  257/77

* cited by examiner

*Primary Examiner* — Mohammad Choudhry
(74) *Attorney, Agent, or Firm* — Amerson Law Firm, PLLC

(57) ABSTRACT

One method includes forming a plurality of first trenches in a semiconductor substrate to thereby define a plurality of initial fins in the substrate, removing at least one, but less than all, of the plurality of initial fins, forming a fin protection layer on at least the sidewalls of the remaining initial fins, with the fin protection layer in position, performing an etching process to extend a depth of the first trenches to thereby define a plurality of final trenches with a final trench depth, wherein the final trenches define a plurality of final fin structures that each comprise an initial fin, removing the fin protection layer, and forming a recessed layer of insulating material in the final trenches, wherein the recessed layer of insulating material has a recessed surface that exposes a portion of the final fin structures.

17 Claims, 10 Drawing Sheets

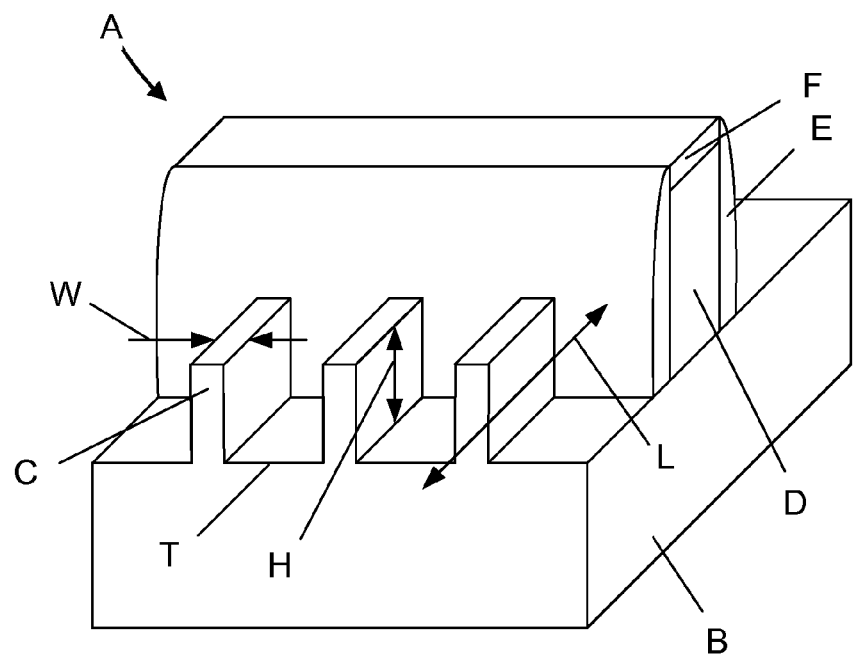
Figure 1A (Prior Art)
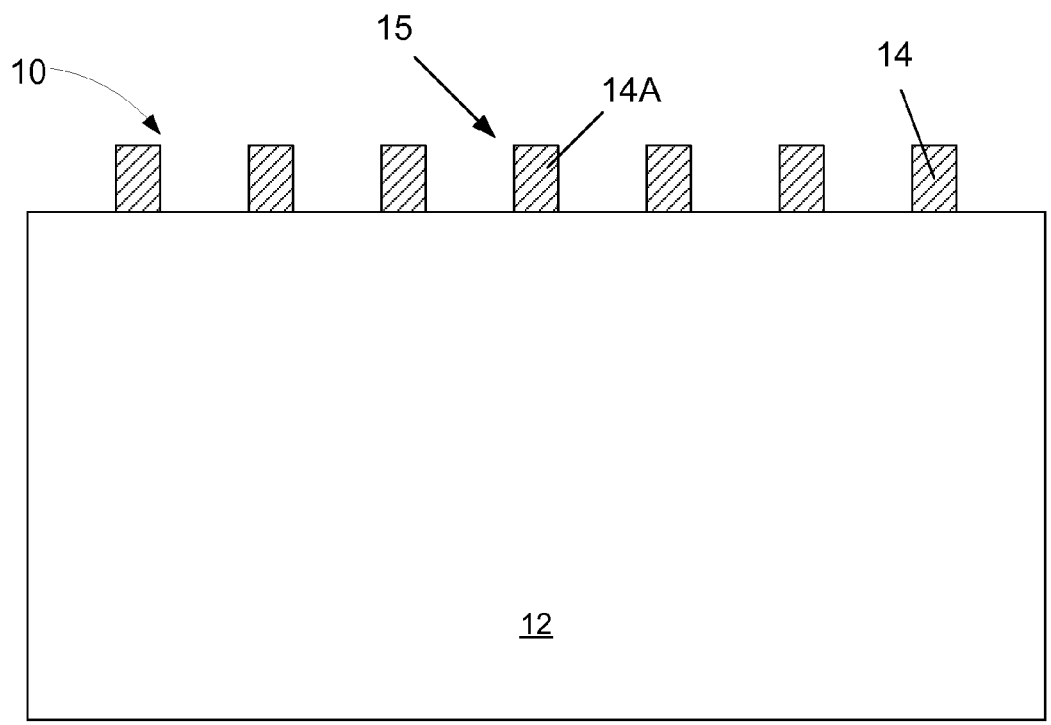
(Prior Art) Figure 1B

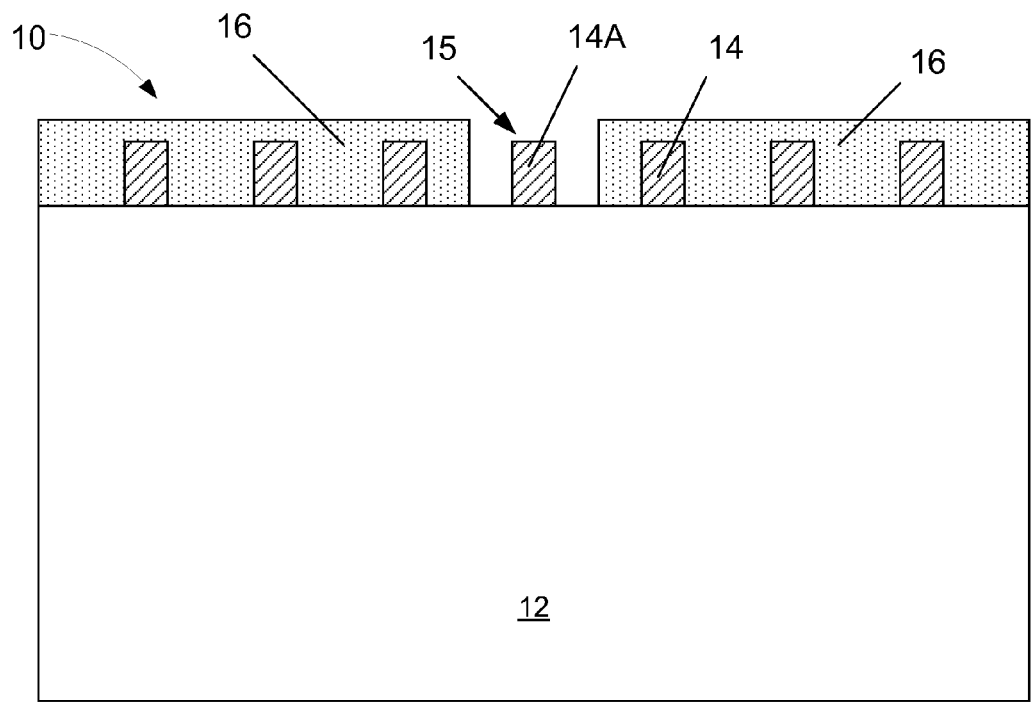
(Prior Art) Figure 1C
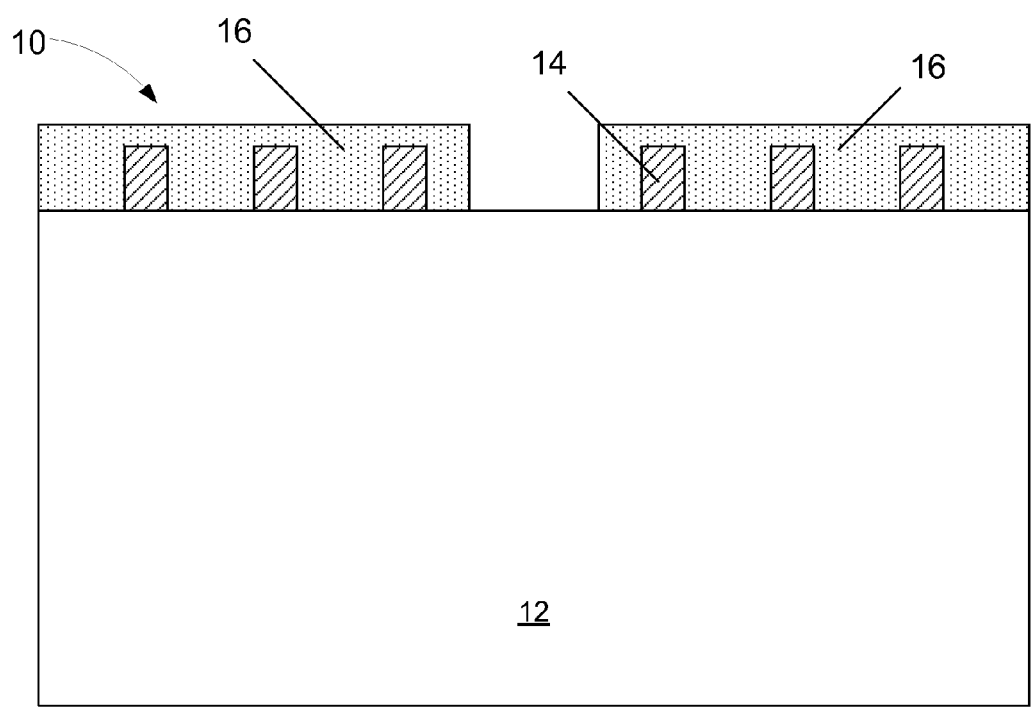
(Prior Art) Figure 1D

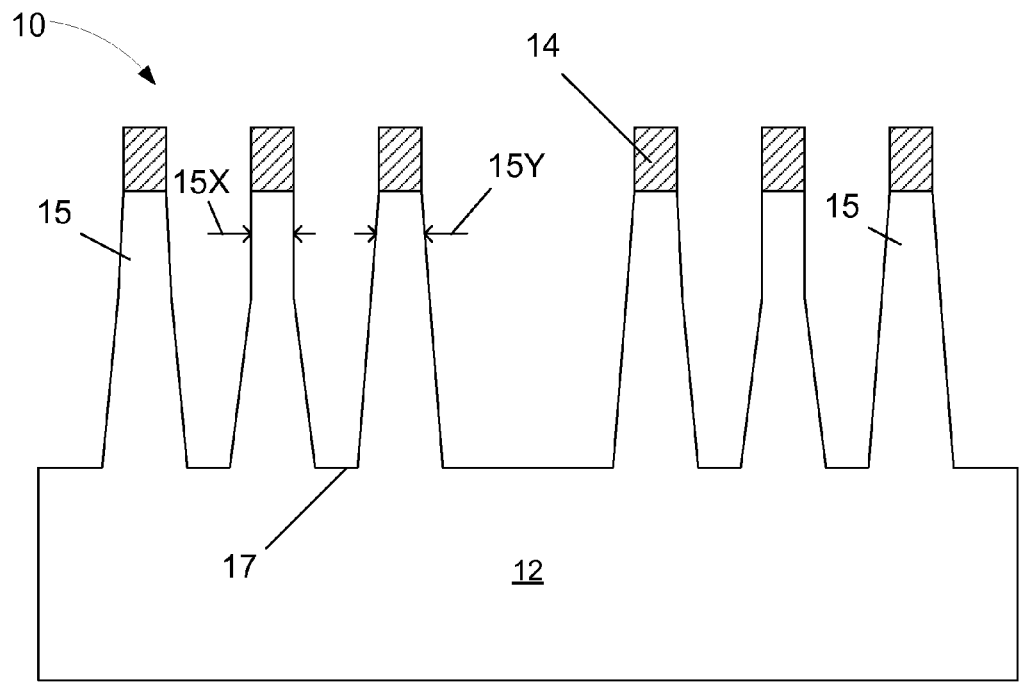
(Prior Art) Figure 1E
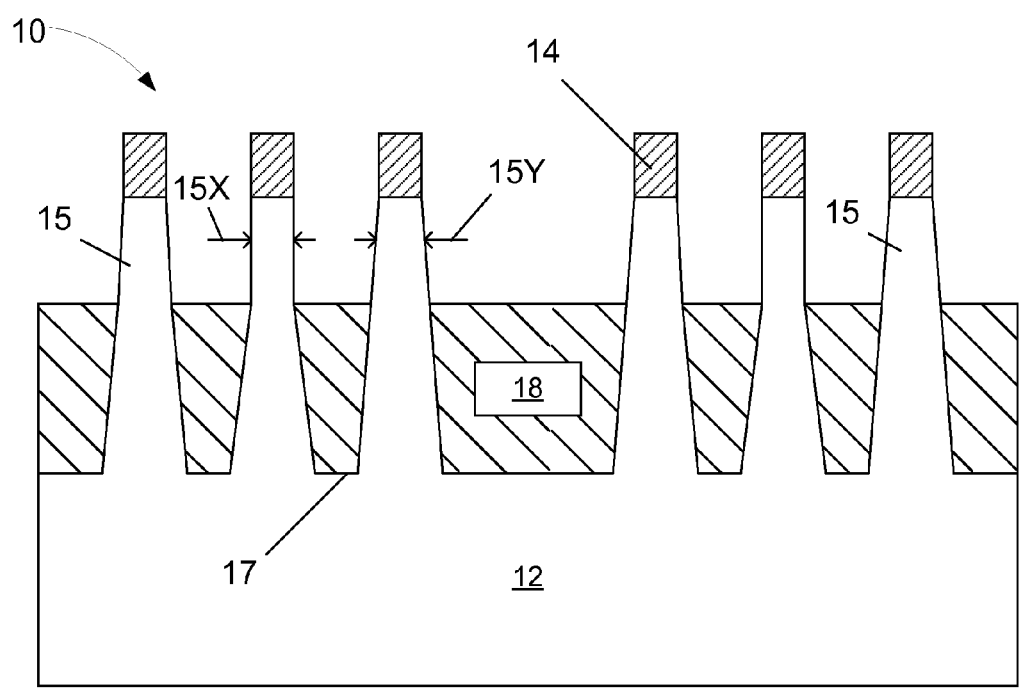
(Prior Art) Figure 1F

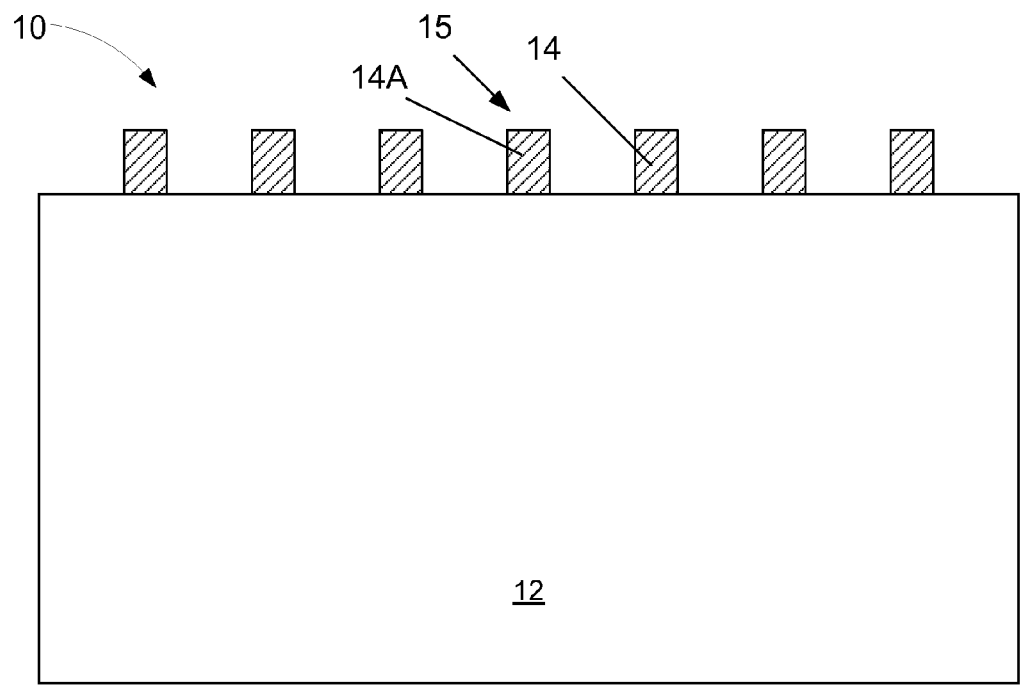
(Prior Art) Figure 1G
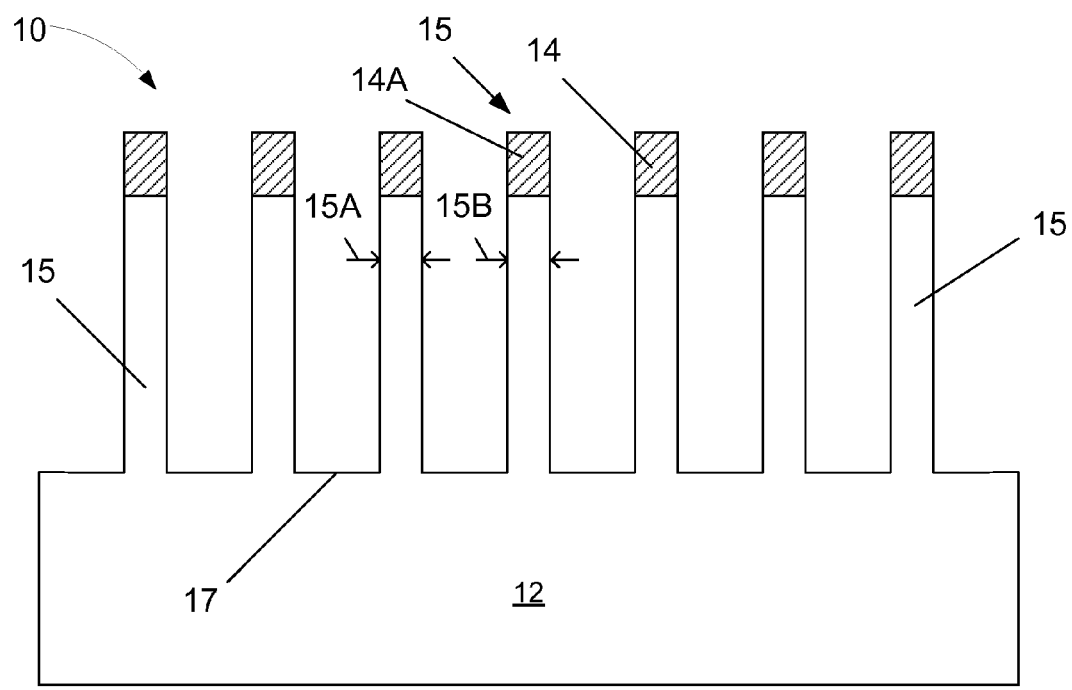
(Prior Art) Figure 1H

METHODS OF FORMING FINS FOR FINFET SEMICONDUCTOR DEVICES AND THE SELECTIVE REMOVAL OF SUCH FINS

BACKGROUND OF THE INVENTION

1. Field of the Invention

Generally, the present disclosure relates to the manufacturing of semiconductor devices, and, more specifically, to various methods of forming fins for FinFET semiconductor devices and the selective removal of some of the fins.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In the FinFET device, the gate structure D may enclose both the sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

Both FET and FinFET semiconductor devices have an isolation structure, e.g., a shallow trench isolation structure, that is formed in the semiconducting substrate around the device so as to electrically isolate the semiconductor device. Traditionally, isolation structures were always the first structure that was formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins. As FinFET devices have been scaled to meet ever increasing performance and size requirements, the width W of the fins C has become very small, e.g., 6-12 nm, and the fin pitch has also been significantly decreased, e.g., the fin pitch may be on the order of about 30-60 nm.

However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form the trenches T in the substrate B to define multiple "fins" that extend across the substrate, and thereafter remove some of the fins C where larger isolation structures will be formed. Using this type of manufacturing approach, better accuracy and repeatability may be achieved in forming the fins C to very small dimensions due to the more uniform environment in which the etching process that forms the trenches T is performed.

After the trenches T have been formed, some of the fins C must be removed to create room for or define the spaces where isolation regions will ultimately be formed. There are two commonly employed techniques for accomplishing the goal of removing the desired number of fins C. One such removal process is typically referred to as "Fins-cut-First," as will be described with reference to FIGS. 1B-1E. Accordingly, FIG. 1B depicts the device 10 after a patterned hard mask layer 14, e.g., a patterned layer of silicon nitride, was formed above the substrate 12 in accordance with the desired fin pattern and pitch. In the depicted example, only a single fin will be removed, i.e., the fin 15 corresponding to the feature 14A, to make room for the isolation region. However, as will be recognized by those skilled in the art, depending upon the desired final size of the isolation region, more than one fin may be removed.

FIG. 1C depicts the device 10 after a patterned masking layer 16, e.g., a patterned layer of photoresist, has been formed above the patterned hard mask layer 14. The patterned masking layer 16 has an opening that exposes the feature 14A for removal.

FIG. 1D depicts the device 10 after an etching process has been performed through the patterned masking layer 16 so as to remove the exposed feature 14A of the patterned hard mask layer 14.

FIG. 1E depicts the device 10 after the patterned masking layer 16 was removed and after an etching process was performed through the patterned hard mask layer 14 (without the feature 14A) so as to define full-depth trenches 17 in the substrate 12 that define the fins 15. Due to the removal of the feature 14A, this etching process removes the portions of the substrate 12 that would have otherwise formed a fin 15 in the area under the feature 14A. One problem with the "fin-cut-first" approach is that it inevitably causes different fin sizes, i.e., the dimensions 15X and 15Y are different. This is especially true between fins 15 inside an array of fins and the fins at the edge of the active region that is close to the isolation region. This occurs due to etch loading effects wherein there are different etch rates and etch profiles due to differing patterning densities, pitch, etc.

FIG. 1F depicts the device 10 after several process operations were performed. First, a layer of insulating material 18, such as silicon dioxide, was formed so as to overfill the trenches 17. A chemical mechanical polishing (CMP) process was then performed to planarize the upper surface of the insulating material 18 with the top of the patterned hard mask 14. Thereafter, an etch-back process was performed to recess the layer of insulating material 18 between the fins 15 and thereby expose the upper portions of the fins 15, which corresponds to the final fin height of the fins 15. At this point in the process, the patterned hard mask 14 may or may not be thereafter removed. Next, the gate structure of the device 10 may be formed using either gate-first or gate-last manufacturing techniques.

Another fin removal process is typically referred to as "Fins-cut-Last," as will be described with reference to FIGS. 1G-1J. FIG. 1G depicts the device 10 after the patterned hard mask layer 14 was formed above the substrate 12 in accordance with the desired fin pattern and pitch. As before, in the depicted example, only a single fin will be removed, i.e., the fin 15 corresponding to the feature 14A, to make room for the isolation region. However, as will be recognized by those skilled in the art, depending upon the desired final size of the isolation region, more than one fin may be removed.

FIG. 1H depicts the device 10 after an etching process was performed through the patterned hard mask layer 14 so as to define full-depth trenches 17 in the substrate 12 that define the fins 15. Note that, in the Fins-cut-Last approach, the size of the fins is very uniform, i.e., the dimension 15A is approximately equal to the dimension 15B. This is primarily due to the fact that, in this approach, fins 15 are formed everywhere on the wafer and there is no undesirable etch loading effects.

FIG. 1I depicts the device 10 after several process operations were performed. First, a layer of insulating material 19, such as silicon dioxide, was formed so as to overfill the trenches 17. Then a CMP process was performed to planarize the upper surface of the layer of insulating material 19 with the patterned hard mask layer 14. Next, a patterned masking layer 22, e.g., a patterned layer of photoresist, was formed above the layer of insulating material 19. The patterned hard mask layer 22 has an opening that exposes the underlying fin for removal.

FIG. 1J depicts the device 10 after one or more etching processes were performed to remove the exposed portions of the layer of insulating material 19, the exposed portions of the hard mask layer 14, i.e., the feature 14A, and the underlying fin 15 by forming a trench 24 in the substrate 12. Inevitably, there will be some tapering of the sidewalls of the trench 24. Although not depicted in the drawings, after the trench 24 is formed, the patterned masking layer 22 will be removed and additional oxide material (not shown) will be formed through the opening 24A in the trench 24 where the fin 15 was removed. Then a chemical mechanical polishing (CMP) process will be performed to planarize the upper surface of all of the insulating materials with the top of the patterned hard mask 14. Thereafter, the isolation regions between devices will be masked and an etch-back process will be performed to recess the layer of insulating material 19 between the fins 15 for each device and thereby expose the upper portions of the fins 15, which corresponds to the final fin height of the fins 15. One problem with the fins-cut-last approach is that if the size (CD) of the opening 24A of the trench 24 is relatively large, then there is less margin for misalignment error when removing the unwanted fin, i.e., there is less margin for error so as to avoid damage to the adjacent fins when the trench 24 is etched. Additionally, although not depicted, if the size of the opening 24A is kept small, there will typically be some residual portion of the fin 15 remaining at the bottom of the trench 24. Conversely, if the size of the opening 24A is increased in an effort to insure complete removal of the unwanted fin at the bottom of the trench 24, then there is a much greater likelihood of damaging the fins adjacent the trench 24 when it is etched. These issues only get worse as the depth of the trench 24 increases.

The present disclosure is directed to various methods of forming fins for FinFET semiconductor devices and the selective removal of some of the fins that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for FinFET semiconductor devices and the selective removal of some of the fins. One illustrative method disclosed herein includes, among other things, forming a plurality of first trenches in a semiconductor substrate to thereby define a plurality of initial fins in the substrate, removing at least one, but less than all, of the plurality of initial fins, forming a fin protection layer on at least the sidewalls of the remaining initial fins, with the fin protection layer in position, performing an etching process to extend a depth of the first trenches to thereby define a plurality of final trenches with a final trench depth, wherein the final trenches define a plurality of final fin structures that each comprise an initial fin, removing the fin protection layer, and forming a recessed layer of insulating material in the final trenches, wherein the recessed layer of insulating material has a recessed surface that exposes a portion of the final fin structures.

Another illustrative method includes, among other things, forming a patterned masking layer above a surface of a semiconductor substrate, performing a first etching process through the patterned masking layer to define a plurality of first trenches in the substrate to thereby define a plurality of initial fins in the substrate, forming a fin removal masking layer above the plurality of initial fins, the fin removal masking layer having an opening positioned above a subset of the initial fins that is desired to be removed, performing at least one second etching process through the opening in the fin removal masking layer to remove the subset of initial fins, after performing the second etching process, removing the fin removal masking layer and forming a fin protection layer on at least the sidewalls of the remaining initial fins, with the fin protection layer in position, performing a third etching process through the patterned masking layer to thereby define a plurality of final trenches with a final trench depth, wherein the final trenches define a plurality of final fin structures that each comprise an initial fin, removing the fin protection layer, and forming a recessed layer of insulating material in the final trenches that exposes a portion of the final fin structures.

One illustrative FinFET device disclosed herein includes, among other things, an upper fin portion, a lower fin portion and a substantially horizontal, stepped transition between the upper fin portion and the lower fin portion, wherein a width of the upper fin portion at a location immediately above the stepped transition is less than a width of the lower fin portion at a location immediately below the stepped transition.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1J depict illustrative prior art methods of removing selected fin structures when forming FinFET semiconductor devices.

Figure 1I:
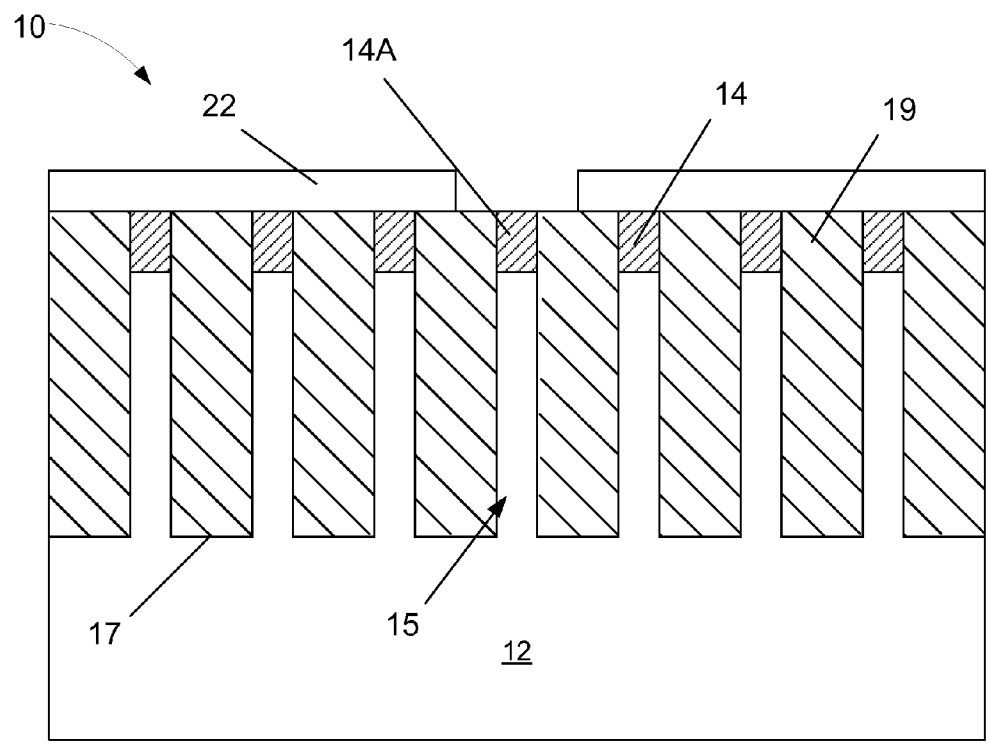
Figure 1J:
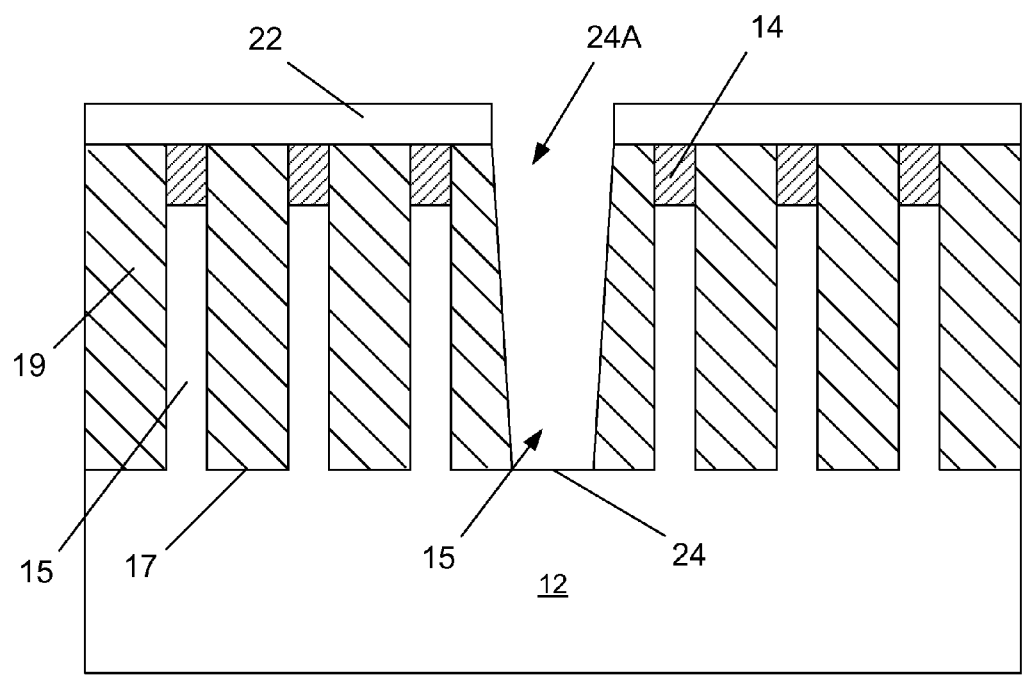

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fins for FinFET semiconductor devices and the selective removal of some of the fins. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

Figure 2A:
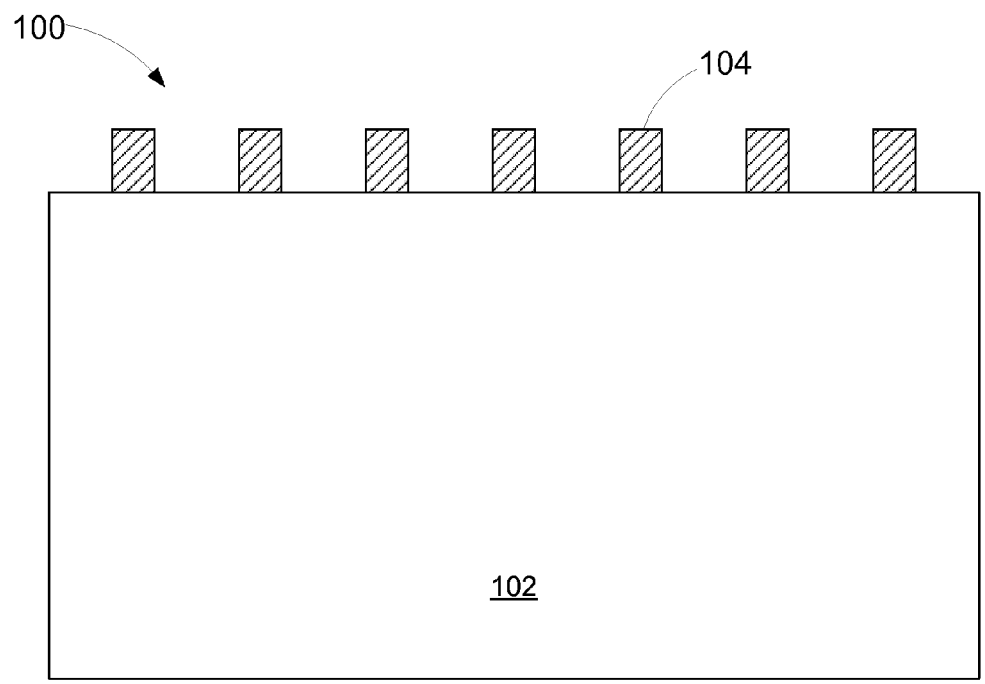
FIGS. 2A-2J depict various illustrative methods disclosed herein for forming fins for FinFET semiconductor devices and the selective removal of some of the fins.

FIGS. 2A-2J depict one illustrative embodiment of a method disclosed herein of forming fins on a FinFET semiconductor device 100 that is formed on a bulk semiconducting substrate 102. FIG. 2A is a simplified view of an illustrative FinFET semiconductor device 100 at an early stage of manufacturing. As will be recognized by those skilled in the art after a complete reading of the present application, the illustrative FinFET device 100 described herein may be either an N-type FinFET device or a P-type FinFET device. In this illustrative embodiment, the substrate 102 has a bulk semiconducting material configuration. The substrate 102 may be made of silicon or it may be made of materials other than silicon. Thus, the terms "substrate" or "semiconducting substrate" should be understood to cover all forms of all semiconductor materials.

FIG. 2A depicts the device 100 after a patterned masking layer 104, e.g., a patterned hard mask layer, has been formed above the substrate 102 that corresponds to the desired pattern of fins to be formed in the substrate 102. The patterned masking layer 104 is intended to be representative in nature as it may be comprised of a variety of materials, such as, for example, a photoresist material, silicon nitride, silicon oxynitride, etc. Moreover, the patterned masking layer 104 may be comprised of multiple layers of material, such as, for example, a silicon nitride layer and a layer of silicon dioxide. The patterned masking layer 104 may be formed by depositing the layer(s) of material that comprise the masking layer 104 and thereafter directly patterning the masking layer 104 using known photolithography and etching techniques. Alternatively, the patterned masking layer 104 may be formed by using known sidewall image transfer techniques. Thus, the particular form and composition of the patterned masking layer 104 and the manner in which it is made should not be considered a limitation of the present invention. In the case where the patterned masking layer 104 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

Figure 2B:
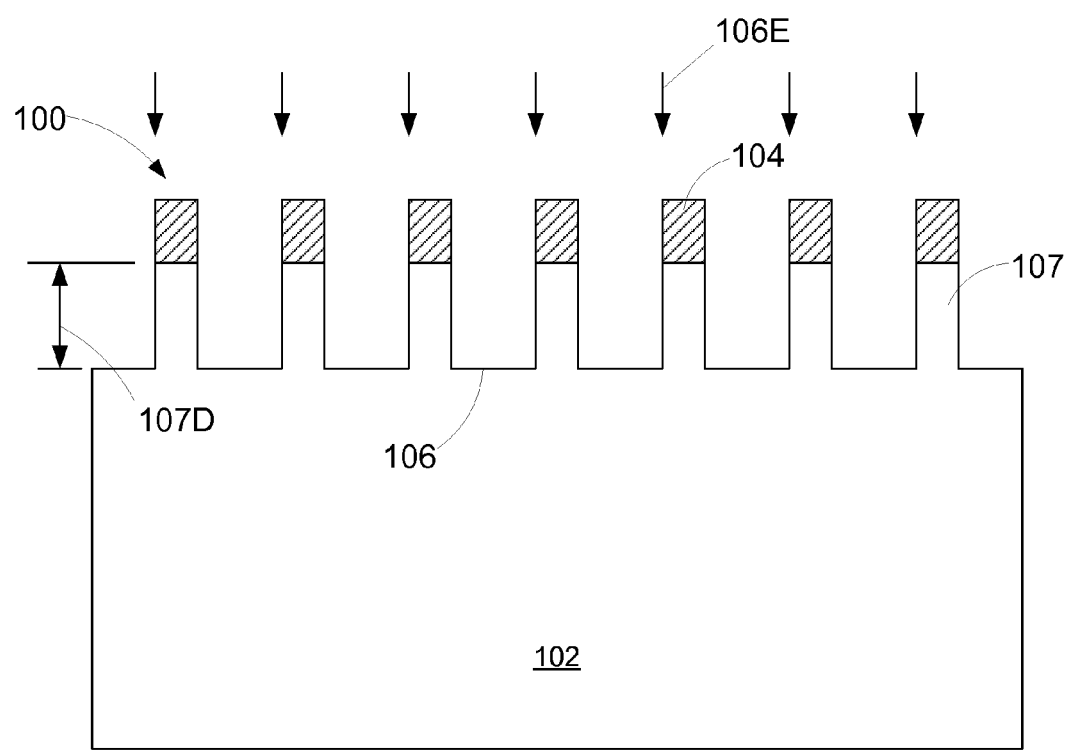

FIG. 2B depicts the device 100 after a first etching process 106E was performed through the patterned masking layer 104 to define a plurality of initial or first trenches 106 in the substrate 102. The first trenches 106 define a plurality of initial fins 107 having a fin height 107D. Due to the fact that the fins 107 are formed across the substrate, there is little or no undesirable variation in the width (CD) of the initial fins 107 since there is no adverse etch loading effects, as discussed in the background section of this application. The magnitude of the fin height 107D may vary depending upon the particular device under construction, e.g., 15-50 nm. In one example, the height 107D may correspond to the final desired fin height for the final fins of the FinFET device 100. In the illustrative example depicted in the attached figures, the trenches 106 and the initial fins 107 are all of a uniform size and shape. However, such uniformity in the size and shape of the trenches 106 and the initial fins 107 is not required to practice at least some aspects of the inventions disclosed herein. In the example depicted herein, the first trenches 106 are depicted as having been formed by performing a plurality of anisotropic etching processes. In some cases, the first trenches 106 may have a reentrant profile near the bottom of the trenches 106. To the extent the first trenches 106 are formed by performing a wet etching process, the first trenches 106 may tend to have a more rounded configuration or non-linear configuration as compared to the generally linear configuration of the first trenches 106 that are formed by performing an anisotropic etching process. In other cases, the first trenches 106 may be formed in such a manner that the initial fins 107 have a tapered cross-sectional configuration (wider at the bottom than at the top at this point in the process flow). Thus, the size and configuration of the initial trenches 106, and the manner in which they are made, should not be considered a limitation of the present invention.

Figure 2C:
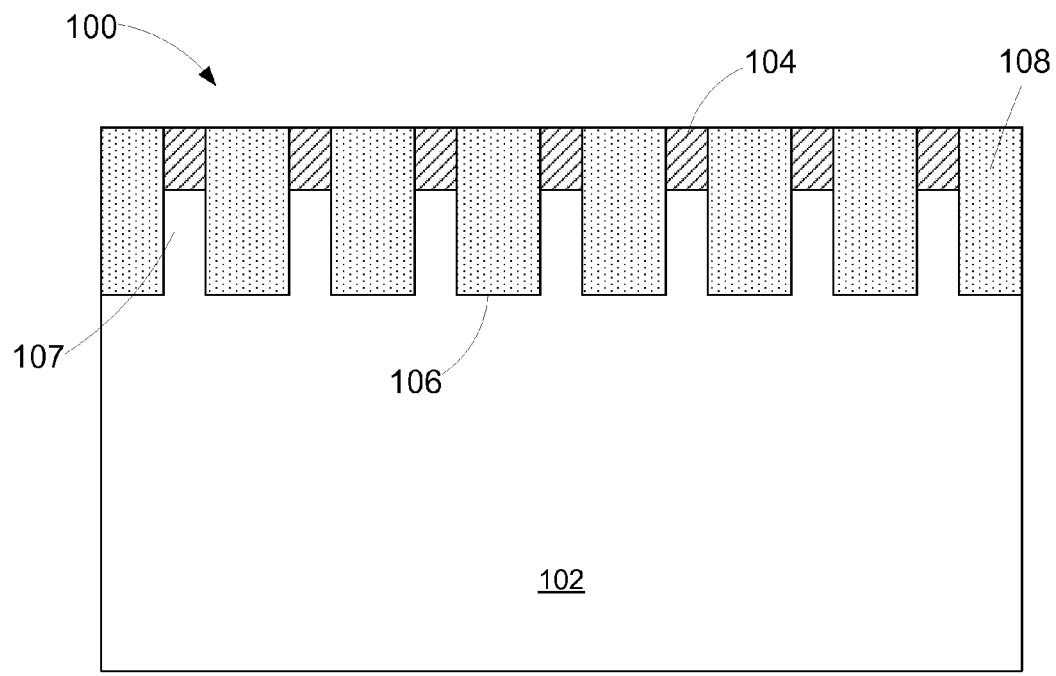

FIG. 2C depicts the device 100 after several process operations have been performed. Initially, in this illustrative embodiment, a fin removal masking material layer 108 was formed so as to overfill the trenches 106. Then, a chemical mechanical polishing (CMP) process was performed to planarize the upper surface of the fin removal masking material layer 108 with the top of the patterned hard mask 104. In some cases, it may not be necessary to perform such a planarizing CMP process. As will be recognized by those skilled in the art after a complete reading of the present application, the inventions disclosed herein may be employed where a variety of materials may be used to overfill the first trenches 106 at this stage of the process flow. In one illustrative embodiment, the fin removal masking material layer 108 may be comprised of one of the DUO™ brand materials sold by Honeywell under the names DUO™ 248, DUO™ 193, a spin-on-glass (SOG) material or an OPL material. In some cases, an additional OPL and ARC layer or a protection layer may be formed above such a fin removal masking material layer 108. However, in the case where the illustrative fin removal masking material layer 108 is made of DUO™, a separate ARC layer may not be required. Thus, the present invention should not be considered to be limited to any particular type of material used for the fin removal masking material layer 108. In the case where the fin removal masking material layer 108 is made of a DUO™ material, it may be formed by performing a spin-coating process.

Figure 2D:
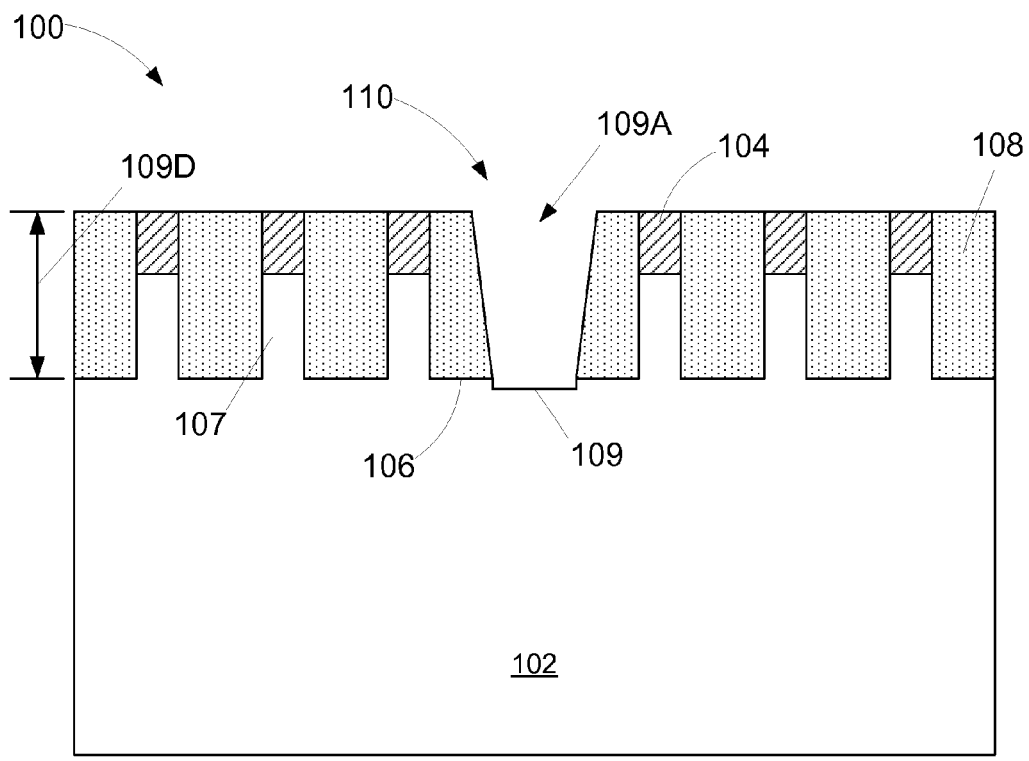

FIG. 2D depicts the device 100 after several process operations were performed. First, the fin removal masking material layer 108 was patterned so as to have an opening 110 that corresponds to the initial fin 107 to be removed. The fin removal masking material layer 108 may be patterned by forming a patterned masking layer (not shown), e.g., a patterned photoresist mask, above the fin removal masking material layer 108, and thereafter performing one or more etching techniques. After the fin removal masking material layer 108 is patterned, the patterned photoresist mask was removed and one or more etching processes were performed though at least the patterned fin removal masking material layer 108 to form a trench 109 so as to remove the desired initial fin 107. This etching sequence may form a slight recess in the substrate 102, as depicted in FIG. 2D. The depth 109D of the trench 109 may vary depending upon the particular application, e.g., 30-60 nm. Importantly, due to the relatively shallow depth 109D of the trench 109 at this point in the process flow, the size (CD) of the opening 109A of the trench can be relatively small, while still insuring that substantially all of the initial fin 107 within the trench 109 is removed. In contrast to the fins-cut-last approach described in the background section of this application, using the methods disclosed herein, the width of the opening 109A may be made relatively smaller than the width of the opening 24A, since the depth of the trench 109 will be relatively shallower than the depth of the trench 24. Accordingly, the sidewalls of the trench 109 will exhibit less tapering, i.e., they will be more vertical, as compared to the sidewalls of the trench 24. In the depicted example, only a single fin has been removed, i.e., the middle fin, to make room for the isolation region. However, as will be recognized by those skilled in the art after a complete reading of the present application, depending upon the desired final size of the isolation region, any number of the initial fins 107 may be removed using the methods disclosed herein.

Figure 2E:
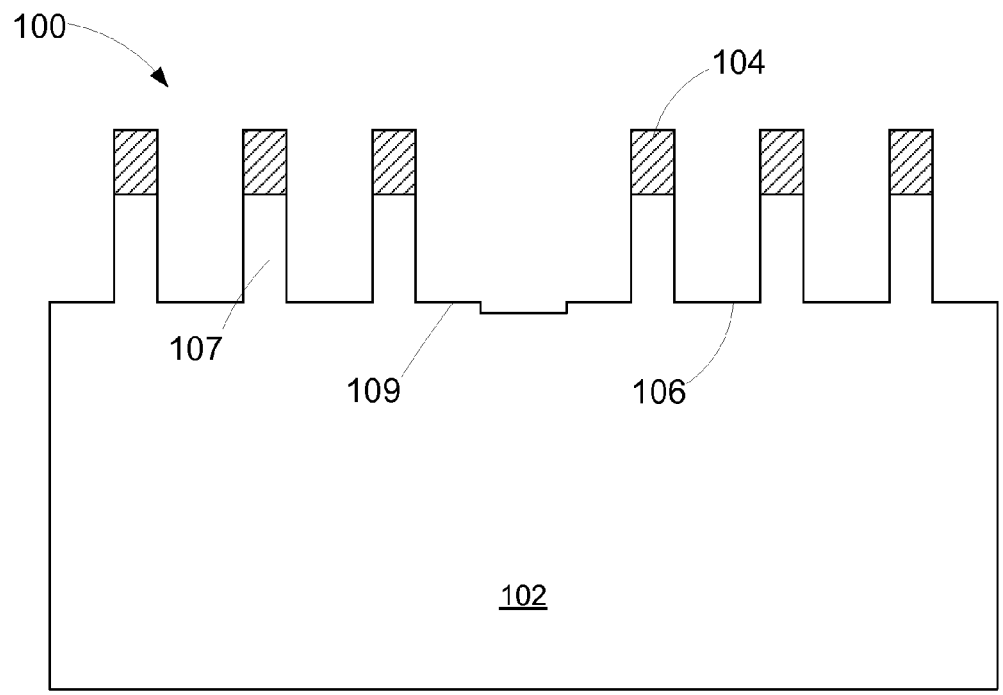

FIG. 2E depicts the device 100 after the patterned fin removal masking material layer 108 was removed. Depending upon the material selected for the fin removal masking material layer 108, it may be removed by performing a wet-stripping process or an etching process.

Figure 2F:
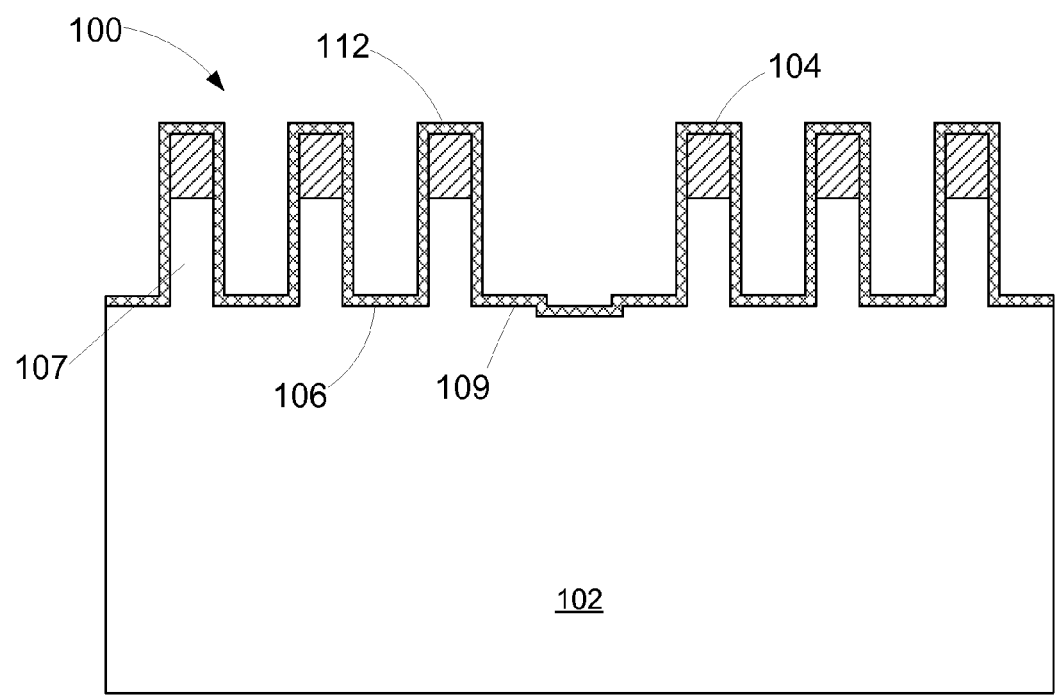

FIG. 2F depicts the device 100 after a fin protection layer 112 was formed on the remaining initial fins 107. The fin protection layer 112 may be comprised of a variety of different materials, it may be formed to any desired thickness and it may be formed using any of a variety of process operations. In one illustrative embodiment, the fin protection layer 112 may be comprised of a material that exhibits good etch selectivity relative to the material of the substrate 102. For example, in one illustrative embodiment, the fin protection layer 112 may be comprised of silicon nitride, silicon dioxide, a high-k (k=10 or greater) hafnium oxide, etc., it may be formed to a thickness of about 2-5 nm, and it may be formed by performing a conformal ALD or CVD process.

Figure 2G:
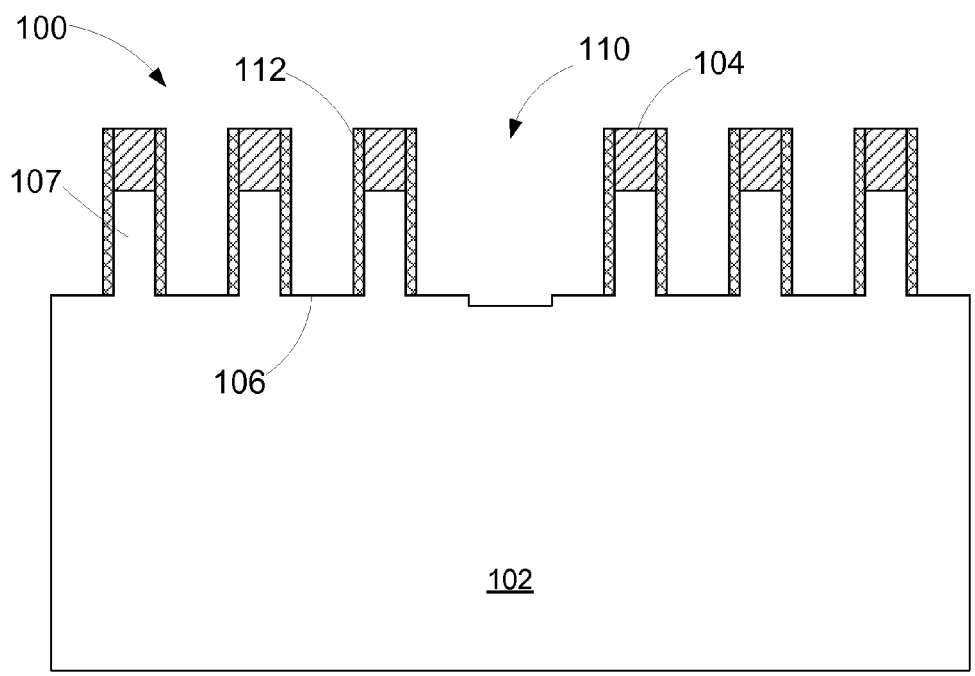

FIG. 2G depicts the device 100 after an anisotropic etching process was performed on the device 100 to remove the substantially horizontally oriented portions of the fin protection layer 112. The process operation exposes the surface of the substrate 102 for further processing while leaving portions of the fin protection layer 112 positioned on the sidewalls of the remaining initial fins 107.

Figure 2H:
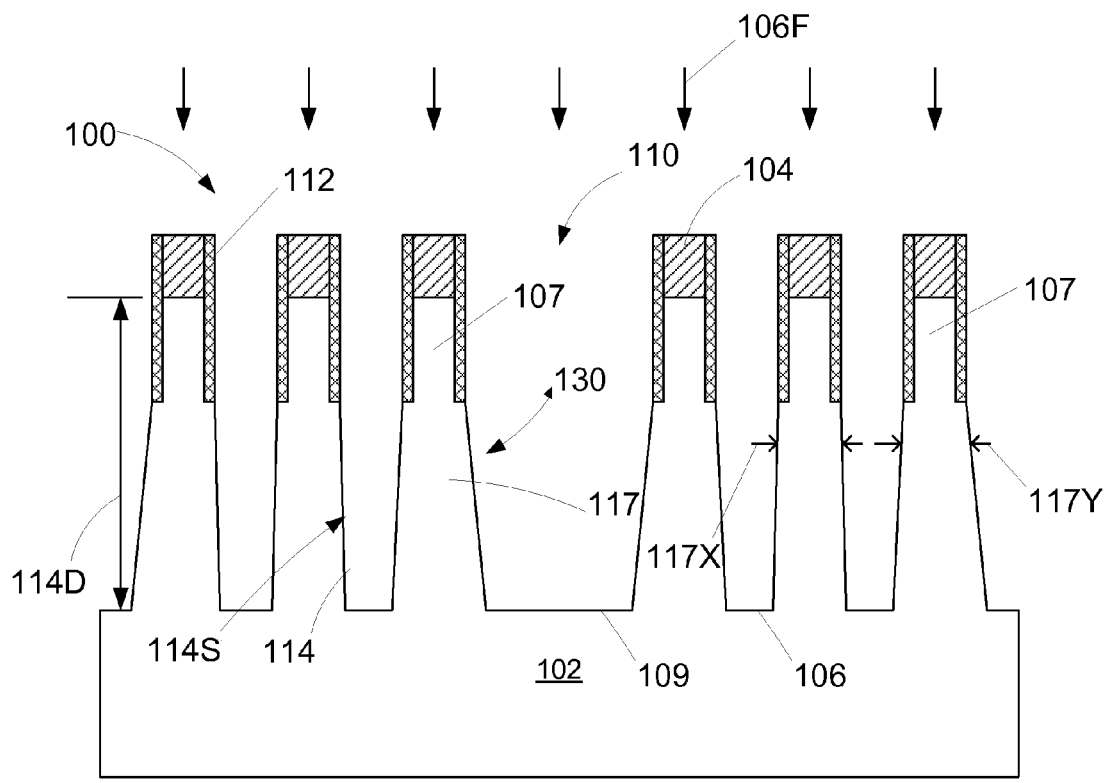

FIG. 2H depicts the device 100 after a second etching process 106F was performed to define a plurality of final trenches 114 that effectively extend the depth of the first trenches 106 to the final desired depth for the device 100. The formation of the final trenches 114 also results in the formation of the final fin structures 130 comprised of lower fin portions 117 that extend downward from the initial fins 107. In one embodiment, the overall depth 114D of the final trenches 114 may vary depending upon the particular device under construction, e.g., 200-300 nm. As usual, when forming trenches of this depth, the sidewalls 114S of the portions of the final trenches 114 formed during the second etching process tend to have a tapered sidewall 114S. Importantly, the fin protection layer 112 remains positioned on the sidewall of the initial fins 107 during the second etching process 106F so as to avoid consumption of the previously formed initial fins 107. As will be appreciated by those skilled in the art after a complete reading of the present application, the methods disclosed herein provide significant advantages relative to the prior art techniques for removing fins discussed in the background section of the application. First, the problem of incomplete removal of the undesired fin in the fins-cut-last approach is resolved because the depth of the trench 109 is less than the depth of the trench 24. Second, substantial uniformity in the width or CD of the initial fins 107 is achieved by avoiding undesirable etch-loading effects when the initial fins 107 are formed. Third, at the time the final trenches 114 are formed, the fin protection layer 112 protects the initial fins 107—i.e., the active, functional part of the fins that will become part of the channel region of the device, from attack and associated dimensional changes. It should be noted that, in forming the final trenches 114, there will likely be some lower fin portions 117 that exhibit different sizes, i.e., the dimensions 117X and 117Y may likely be different. However, this dimensional difference is not important as the lower fin portions 117 are essentially non-active portions of the overall fin structure. Other advantages of the presently disclosed inventions will also be appreciated by those skilled in the art after a complete reading of the present application. Thus, due to the relatively shallow depth of the initial trenches 106 and the fin protection layer 112, the initial fins 107 may be formed to more exacting dimension and not suffer from distortion when, like in the prior art, the fins were formed by performing a single etching process to define the trenches to their desired final depth in the substrate. In the illustrative example depicted in the attached figures, the final trenches 114 are all of a uniform size and shape, except where the middle initial fin was removed. However, such uniformity in the size and shape of the final trenches 114 is not required to practice at least some aspects of the inventions disclosed herein. Thus, the size and configuration of the final trenches 114, and the manner in which they are made, should not be considered a limitation of the present invention.

Figure 2I:
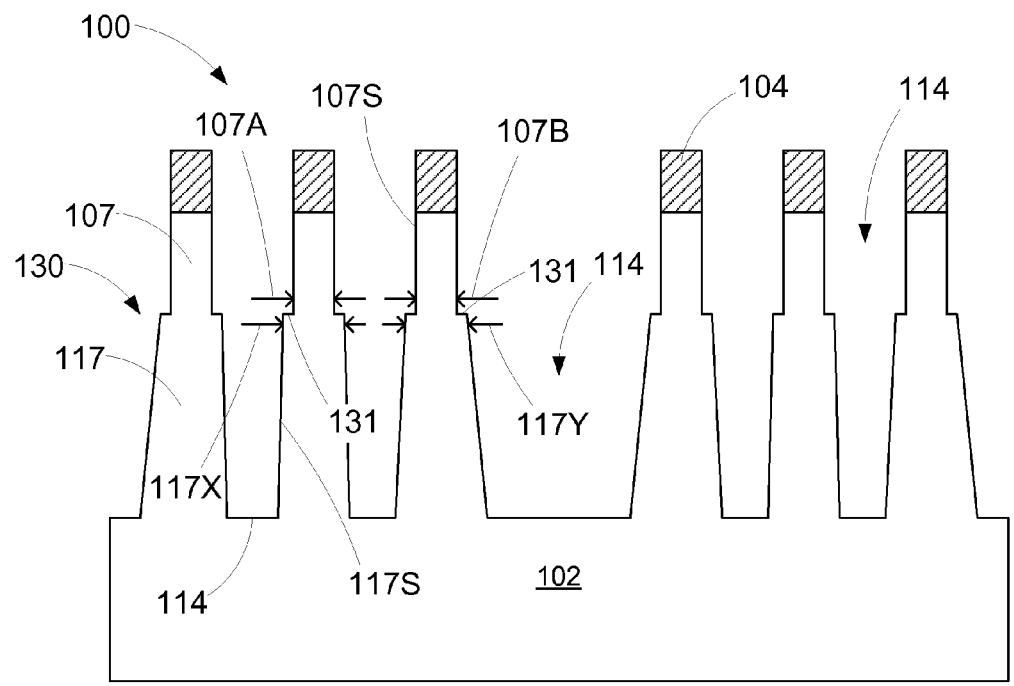

FIG. 2I depicts the device 100 after the remaining portions of the fin protection layer 112 were removed by performing an etching or a stripping process. Due to the presence of the fin protection layer 112 on the sidewalls 107S of the upper or initial fins 107 during the second etching process 106F, the overall final fin structure 130 (comprised of the upper initial fin portion 107 and the lower fin portion 117) has a stepped cross-sectional profile, as reflected by the lip or ledge 131. Also note that the width 107A, 107B of adjacent initial fin structures 107 may be substantially the same (i.e., within 1 nm of each other), while, as discussed previously, the widths 117X, 117Y of the lower fin portions 117 on adjacent fins may be different, i.e., greater than 2 nm. As will be appreciated by those skilled in the art after a complete reading of the present application, a novel FinFET device structure is disclosed herein. That is, in one embodiment, the FinFET device 100 comprises an upper fin portion 107, a lower fin portion 117 and a substantially horizontal, stepped transition 131 between the upper fin portion 107 and the lower fin portion 117, wherein a width 107A of the upper fin portion 107 at a location immediately above the stepped transition 131 is less than a width 117X of the lower fin portion 117 at a location immediately below the stepped transition 131. In one embodiment, the width variation of the upper FIN portions 107 is very small, i.e., the delta between 107A and 107B is very small (<1 nm), and the variation of bottom FIN portions 117 is relative larger. i.e., the delta between 117X and 117Y can be more than 2 nm. Also using the novel methods disclosed herein, the sidewalls 107S of the upper fin portions 107 are substantially vertical, while the sidewalls 117S of the lower fin portions 117 are tapered.

Figure 2J:
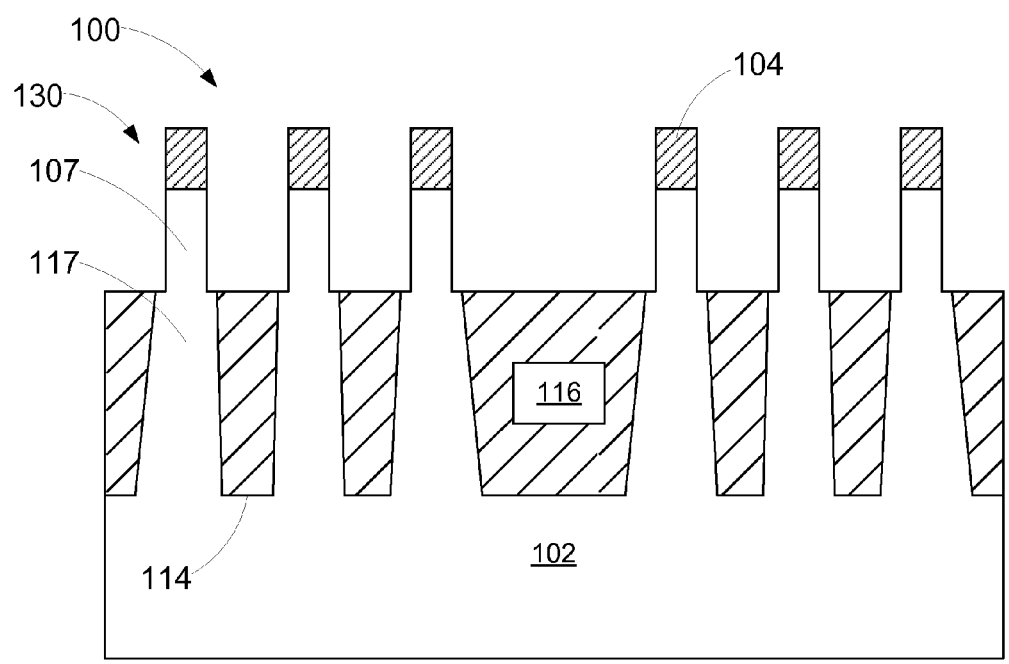

FIG. 2J depicts the device 100 after several process operations were performed. First, a layer of insulating material 116, such as silicon dioxide, was formed so as to overfill the final trenches 114. A chemical mechanical polishing (CMP) process was then performed to planarize the upper surface of the insulating material 116 with the top of the patterned hard mask layer 104. Thereafter, an etch-back process was performed to recess the layer of insulating material 116 to the desired level between the fins 130 and thereby expose a desired amount of the final fin structures 130, which corresponds to the final fin height for the fins of the device 100. In one embodiment, the recessing may be performed such that the recessed layer of insulating material 116 exposes the initial fin 107 portion of the final fin structure 130. At this point in the process, the patterned hard mask 104 may or may not be thereafter removed. Next, a gate structure (not shown) of the device 100 may be formed using either gate-first or gate-last manufacturing techniques. The gate structure will comprise a gate insulation material and a gate electrode positioned around at least a portion of the initial fin portion 107 of the final fin structure 130.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of first trenches in a semiconductor substrate to thereby define a plurality of initial fins in said substrate, said plurality of first trenches exposing sidewalls of said plurality of initial fins;
    after defining said plurality of initial fins, completely filling each of said plurality of first trenches with a masking material, said masking material completely covering said exposed sidewalls of said plurality of initial fins;
    removing at least one, but less than all, of said plurality of initial fins while said masking material is present in said plurality of first trenches;
    after removing said at least one of said plurality of initial fins, forming a fin protection layer on at least said sidewalls of the remaining initial fins;
    with said fin protection layer in position, performing an etching process to extend a depth of said first trenches to thereby define a plurality of final trenches with a final trench depth, wherein said final trenches define a plurality of final fin structures that each comprise an initial fin;
    removing said fin protection layer; and
    forming a recessed layer of insulating material in said final trenches, wherein the recessed layer of insulating material has a recessed surface that exposes a portion of said final fin structures.

2. The method of claim 1, wherein said plurality of initial fins in the substrate are formed to a final desired fin height for a FinFET device.

3. The method of claim 1, wherein forming said fin protection layer on at least the sidewalls of the remaining initial fins comprises:
    performing a conformal deposition process to deposit said fin protection layer on an upper surface of a patterned masking layer, said sidewalls of said remaining initial fins and on a bottom of said first trenches; and
    performing an anisotropic etching process on said deposited fin protection layer.

4. A method, comprising:
    forming a patterned masking layer above a surface of a semiconductor substrate;
    performing a first etching process through said patterned masking layer to define a plurality of first trenches in said substrate to thereby define a plurality of initial fins in said substrate;
    forming a fin removal masking layer above said plurality of initial fins, said fin removal masking layer having an opening positioned above a subset of said plurality of initial fins that is desired to be removed, wherein said subset of initial fins is comprised of at least one, but less than all, of said plurality of initial fins;
    performing at least one second etching process through said opening in said fin removal masking layer to remove said subset of initial fins;
    after performing said at least one second etching process, removing said fin removal masking layer and forming a fin protection layer on at least the sidewalls of the remaining initial fins;
    with said fin protection layer in position, performing a third etching process through said patterned masking layer to thereby define a plurality of final trenches with a final trench depth, wherein said final trenches define a plurality of final fin structures that each comprise an initial fin;
    after performing said third etching process, removing said fin protection layer; and
    forming a recessed layer of insulating material in said final trenches, wherein said recessed layer of insulating material has a recessed surface that exposes a portion of said final fin structures.

5. The method of claim 4, wherein performing said first etching process through said patterned masking layer is performed such that said plurality of initial fins in said substrate are formed to a final desired fin height for a FinFET device.

6. The method of claim 4, wherein said fin removal masking layer is comprised of at least one of DUO™ 248, DUO™ 193 or OPL.

7. The method of claim 4, wherein forming said fin protection layer on at least the sidewalls of the remaining initial fins comprises:
    performing a conformal deposition process to deposit said fin protection layer on an upper surface of said patterned masking layer, said sidewalls of said remaining initial fins and on a bottom of said first trenches; and
    performing an anisotropic etching process on said deposited fin protection layer.

8. The method of claim 4, wherein said patterned masking layer is a patterned hard mask layer.

9. The method of claim 4, wherein said fin protection layer is comprised of silicon nitride, silicon dioxide or a high-k material.

10. A method, comprising:
    forming a patterned hard mask layer above a surface of a semiconductor substrate;
    performing a first etching process through said patterned hard mask layer to define a plurality of first trenches in said substrate to thereby define a plurality of initial fins in said substrate;

forming a fin removal masking layer above said plurality of initial fins, said fin removal masking layer having an opening positioned above a subset of said plurality of initial fins that is desired to be removed, wherein said subset of initial fins is comprised of at least one, but less than all, of said plurality of initial fins;

performing at least one second etching process through said opening in said fin removal masking layer to remove said subset of initial fins;

removing said fin removal masking layer;

performing a conformal deposition process to deposit a fin protection layer on an upper surface of said patterned hard mask layer, said sidewalls of said remaining initial fins and on a bottom of said first trenches;

performing an anisotropic etching process on said deposited fin protection layer so as to remove substantially horizontally positioned portions of said fin protection layer while leaving said fin protection layer on at least the sidewalls of the remaining initial fins;

with said fin protection layer in position, performing a third etching process through said patterned hard mark layer to thereby define a plurality of final trenches with a final trench depth, wherein said final trenches define a plurality of final fin structures that each comprise an initial fin;

after performing said third etching process, removing said fin protection layer; and forming a recessed layer of insulating material in said final trenches, wherein said recessed layer of insulating material has a recessed surface that exposes a portion of said final fin structures.

11. The method of claim 10, wherein performing said first etching process through said patterned hard mask layer is performed such that said plurality of initial fins in said substrate are formed to a final desired fin height for a FinFET device.

12. The method of claim 10, wherein said fin removal masking layer is comprised of at least one of DUO™ 248, DUO™ 193 or OPL.

13. The method of claim 10, wherein said fin protection layer is comprised of silicon nitride, silicon dioxide or a high-k material.

14. The method of claim 1, wherein said masking material comprises one of a spin-on-glass material, of DUO™ 248, and DUO™ 193.

15. The method of claim 1, further comprising removing said masking material from each of said plurality of first trenches prior to forming said fin protection layer.

16. The method of claim 1, wherein completely filling each of said plurality of first trenches with said masking material comprises:
  overfilling each of said plurality of first trenches with said masking material such that excess portions of said masking material are formed outside of each respective first trench; and
  planarizing an upper surface of said masking material by removing said excess portions thereof.

17. The method of claim 16, wherein planarizing said upper surface of said masking material comprises performing a chemical mechanical polishing process and exposing a patterned hard mask used to form said plurality of first trenches.

* * * * *